(12) United States Patent
Ziegner et al.

(10) Patent No.: US 6,903,541 B2
(45) Date of Patent: Jun. 7, 2005

(54) FILM-BASED MICROWAVE AND MILLIMETER-WAVE CIRCUITS AND SENSORS

(75) Inventors: Bernhard Alphonso Ziegner, Tyngsborough, MA (US); Robert John Sletten, Bow, NH (US)

(73) Assignee: Tyco Electronics Corporation, Middletown, PA (US)

(*) Notice: Subject to any disclaimer, the term of this patent is extended or adjusted under 35 U.S.C. 154(b) by 239 days.

(21) Appl. No.: 09/864,123

(22) Filed: May 25, 2001

(65) Prior Publication Data

US 2002/0175669 A1 Nov. 28, 2002

(51) Int. Cl.$^7$ .......................... G01R 23/04; H05K 1/00
(52) U.S. Cl. .................. 324/95; 174/254; 361/749
(58) Field of Search .................. 324/95, 158.1; 174/250, 254–260; 361/748–753, 757, 760, 762; 333/238, 247, 246

(56) References Cited

U.S. PATENT DOCUMENTS

| | | | | |
|---|---|---|---|---|
| 3,596,228 A | * | 7/1971 | Reed et al. ................ | 439/513 |
| 5,282,312 A | * | 2/1994 | DiStefano et al. ........... | 29/830 |
| 5,500,556 A | * | 3/1996 | Kosugi ....................... | 257/718 |
| 5,585,162 A | * | 12/1996 | Schueller ................... | 428/131 |
| 5,631,446 A | * | 5/1997 | Quan ......................... | 174/254 |
| 5,879,787 A | * | 3/1999 | Petefish ..................... | 428/209 |
| 5,885,710 A | * | 3/1999 | MacDonald et al. ....... | 428/375 |
| 6,477,057 B1 | * | 11/2002 | Buffet et al. ............... | 361/780 |
| 6,486,408 B1 | * | 11/2002 | Morris ....................... | 174/254 |

OTHER PUBLICATIONS

Steve Berry et al, "Flex Tape Use for Area–Array Substrates Will Grow Rapidly," Jan.–Feb. 2000, Chip Scale Review, Internet address: http://www.chipscalerview.com/archives/ES/issues/0100/flex3.html.*

Ernsberger, Craig N. and Thomas, Sunil, "Colaminated Single and Multichip Package Development," 1997 International Conference on Multichip Modules, pp. 134–141 (May 1997).*

F. Alessandri et al., "Full–Wave Modeling of Via Hole Grounds in Microstrip by Three–Dimensional Mode Matching Technique," 1992 IEEE MTT–S Digest, pp. 1237–1240, (month unavailable).

* cited by examiner

*Primary Examiner*—Vinh Nguyen
*Assistant Examiner*—Russell M. Kobert

(57) ABSTRACT

Flexible multilayer microwave or mm-wave circuits and sensors are provided having at least (a) a first metallization layer, at least a portion of the first metallization layer being adapted for operation at a frequency ranging from 20 GHz to 100 GHz; (b) a second metallization layer, at least a portion of the second metallization layer being adapted for operation as a ground plane; (c) a dielectric substrate layer, the dielectric substrate layer being disposed between the first and second metallization layers; and (d) a plurality of conductive vias extending through the dielectric substrate layer and electrically connecting portions of the first and second metallization layers.

42 Claims, 5 Drawing Sheets

FILM-BASED MICROWAVE AND MILLIMETER-WAVE CIRCUITS AND SENSORS

FIELD OF THE INVENTION

The present invention relates to microwave and millimeter wave circuits and devices, and more particularly to flexible microwave and millimeter wave circuits and devices that can be produced by continuous processing techniques.

BACKGROUND

State-of-the-art manufacturing technology for microwave and millimeter wave circuits is based on rigid and semi-rigid printed wiring board technology in which panelized sections are produced for subsequent singulation into individual circuit assemblies.

Such circuit assemblies, however, are relatively high in cost. Moreover, their rigidity makes them undesirable in applications where physical flexibility is required, for example, where conformation to a curved surface is required.

Continuous film processing technology is currently used in connection with the manufacture of microelectronic packaging, such as chip scale packaging (CSP) and ball grid array (BGA) packaging, and in the manufacture of flexible circuit assemblies, such as those found in many small consumer appliances. Such devices are made by continuous roll-to-roll processing methods, which employ patterned metal films in flex and rigid-flex assemblies, and also employ micro-via technology where appropriate.

Although continuous film processing technology in the above technologies is well developed, it is not known that such technology is in use in the production of microwave and millimeter wave circuits and microwave and millimeter wave devices, such as microwave and millimeter wave sensors and communication devices. Nor is it known to manufacture such microwave and millimeter wave circuits and devices in flexible form.

SUMMARY OF THE INVENTION

According to a first embodiment of the invention, a multilayer microwave or mm-wave circuit is provided. The multilayer microwave or mm-wave circuit is a flexible circuit. The circuit comprises: (a) a first metallization layer, at least a portion of the first metallization layer being adapted for operation at a frequency ranging from 20 GHz to 100 GHz; (b) a second metallization layer, at least a portion of the second metallization layer being adapted for operation as a ground plane; (c) a dielectric substrate layer, the dielectric substrate layer being disposed between the first and second metallization layers; and (d) a plurality of conductive vias extending through the dielectric substrate layer and electrically connecting portions of the first and second metallization layers. The dielectric substrate layer preferably has a thickness ranging from 50 to 250 microns and a dielectric constant ranging from 1 to 3.5. The metallization layers can be provided on a polymer layer (e.g., one having a thickness of less than 50 microns) if desired.

According to a second embodiment of the invention, a multilayer microwave or mm-wave circuit is provided. As in the prior embodiment, the multilayer microwave or mm-wave circuit is a flexible circuit. The circuit comprises: (1) a first metallized polymer layer comprising (a) a first polymer layer having a thickness of less than 50 microns and (b) a first metallization layer disposed on the first polymer layer, at least a portion of the first metallization layer being adapted for operation at a frequency ranging from 20 GHz to 100 GHz; (2) a second metallized polymer layer comprising (a) a second polymer layer having a thickness of less than 50 microns and (b) a second metallization layer disposed on the second polymer layer, at least a portion of the second metallization layer being adapted for operation as a ground plane; (3) a dielectric substrate layer disposed between the first metallized polymer layer and the second metallized polymer layer; and (4) a plurality of conductive vias extending through the dielectric substrate layer and electrically connecting portions of the first and second metallization layers.

The dielectric substrate layer preferably ranges from 50 to 250 microns in thickness and preferably has a dielectric constant ranging from 1 to 3.5. The dielectric substrate layer is preferably a polymethylpentene layer, but can be formed from other materials.

Preferably, the first and second metallization layers range from 0.2 to 3 microns in thickness. The first and second metallization layers can be, for example, copper layers. They can also comprise, for example, sublayers of copper, nickel and gold.

The first and second polymer layers preferably range from 10 to 25 microns in thickness and are preferably formed from polyimide, but can be formed from other materials.

In many cases, the first and second metallized polymer layers are formed by establishing a fold in a unitary metallized polymer layer.

The first polymer layer, the second polymer layer, and the dielectric substrate layer are preferably able to withstand sustained temperatures of 150° C. or more.

Typically, microwave or mm-wave circuit components, such as discrete semiconductor components or integrated circuit chips, are disposed on the first metallization layer. These components can be attached, for example, by means of chip and wire assembly, chip-on-board assembly and/or flip-chip assembly.

The first metallized polymer layer and the second metallized polymer layer are preferably adhered to the dielectric substrate layer by an adhesive layer, which typically ranges from 10 to 25 microns in thickness.

The vias typically comprise conductive epoxy-filled through-holes and/or metal-plated through-holes. The through-holes can be formed, for example, by laser ablation and/or by mechanical punching operations. Several of the vias are preferably spaced from one another by a distance of 0.25 times the operating wavelength or less.

According to a third embodiment of the invention, a microwave or mm-wave sensor is provided. The microwave or mm-wave sensor is a flexible sensor. The sensor comprises:

(1) an antenna section comprising a first metallized polymer film layer;
(2) a microwave or mm-wave circuit section comprising (a) microwave or mm-wave circuit components and (b) a second metallized polymer film layer, which further comprises metallization adapted for operation at frequencies ranging from 20 GHz to 100 GHz;
(3) a signal processing and control section comprising (a) signal processing and control components and (b) a third metallized polymer film layer, which further comprises metallization adapted for the signal processing and control components;

(4) a fourth metallized polymer film layer comprising grounding metallization, wherein portions of the second and fourth metallized polymer film layers are interconnected with one another by a plurality of conductive vias;

(5) a fifth metallized polymer film layer comprising grounding metallization, wherein portions of the third and fifth metallized polymer film layers are interconnected with one another by a plurality of conductive vias; and (6) a plurality of dielectric layers disposed between the first, second, third, fourth and fifth metallized polymer film layers.

Preferably, the first, second, third, fourth and fifth metallized polymer film layers are formed by establishing folds in a unitary piece of metallized polymer film, and the fifth metallized polymer film layer preferably comprises metallization lines connecting the second metallized polymer film layer with the third metallized polymer film layer.

In some instances, the first metallized polymer film layer comprises a patch antenna array, the fourth metallized polymer film layer is disposed between the first and second metallized polymer film layers, and the grounding metallization of the fourth metallized polymer film layer comprises a plurality of antenna feed slots.

The dielectric layers preferably comprise both dielectric polymer foam layers and dielectric solid polymer layers. The metallized polymer film layers and the dielectric layers are preferably bonded together by a plurality of adhesive layers.

In some instances, the microwave or mm-wave circuit components and the signal processing and control components are separated from one another by an ungrounded parasitic shield layer.

According to a fourth embodiment of the invention, a microwave or mm-wave sensor is provided. The microwave or mm-wave sensor is a flexible sensor. The sensor comprises:

(1) an antenna section comprising a first metallized polymer layer, the first metallized polymer layer further comprising (i) a first polymer layer having a thickness of less than 50 microns and (ii) a first metallization layer disposed on the first polymer layer, at least a portion of the first metallization layer comprising a patch antenna array;

(2) a microwave or millimeter wave circuit section over the antenna section, the microwave or millimeter wave circuit section comprising (a) microwave or millimeter wave circuit components and (b) a second metallized polymer layer, the second metallized polymer layer further comprising (i) a second polymer layer having a thickness of less than 50 microns and (ii) a second metallization layer disposed on the second polymer layer, at least a portion of the second metallization layer being adapted for operation at a frequency ranging from 20 GHz to 100 GHz;

(3) a signal processing and control section over the microwave or millimeter wave circuit section, the signal processing and control section comprising (a) signal processing and control circuit components and (b) a third metallized polymer layer which further comprises: (i) a third polymer layer having a thickness of less than 50 microns and (ii) a third metallization layer disposed on the third polymer layer adapted for the signal processing and control circuit components;

(4) a first ground-dielectric section between the antenna section and the microwave or millimeter wave circuit section, the first ground-dielectric section comprising: (a) a first dielectric layer, (b) a first ground layer over the first dielectric layer and (c) a second dielectric layer over the first ground layer; and (5) a second ground-dielectric section between the microwave or millimeter wave circuit section and the signal processing and control section, the second ground-dielectric section comprising: (a) a third dielectric layer, (b) a second ground layer over the third dielectric layer and (c) a fourth dielectric layer over the second ground layer.

In some instances, the microwave or millimeter wave circuit section is oriented such that the microwave or millimeter wave circuit components are on a side of the second metallized polymer layer opposite the antenna section, and the signal processing and control section is oriented such that the processing and control components are on a side of the third metallized polymer layer opposite the antenna section. In these instances, the first ground layer is preferably provided with a plurality of antenna feed slots, the first dielectric layer is preferably a polymer foam layer disposed adjacent the antenna section, the second dielectric layer is preferably a solid polymer layer, the third dielectric layer is preferably a polymer foam layer disposed adjacent the microwave or millimeter wave circuit components, and the fourth dielectric layer preferably is a solid polymer layer. The sensor in these instances also preferably includes a fifth dielectric polymer foam layer adjacent the processing and control components. A plurality of conductive vias preferably extends through the second dielectric layer and electrically connects the first ground layer with second metallization layer. Likewise a plurality of conductive vias preferably extends through the fourth dielectric layer and electrically connects the second ground layer with the third metallization layer. The first ground layer is preferably provided on a fourth metallized polymer layer which comprises: (i) a fourth polymer layer having a thickness of less than 50 microns and (ii) a fourth metallization layer disposed on the fourth polymer layer, wherein at least a portion of the fourth metallization layer is adapted for operation as a ground layer. The second ground layer is preferably provided on a fifth metallized polymer layer which comprises: (i) a fifth polymer layer having a thickness of less than 50 microns and (ii) a fifth metallization layer disposed on the fifth polymer layer, wherein at least a portion of the fifth metallization layer is adapted for operation as a ground layer. The first, second, third, fourth and fifth metallized polymer layers are preferably formed by establishing folds in a unitary metallized polymer layer, and the fifth metallization layer preferably contains metallization lines connecting the second metallization layer with the third metallization layer.

In other instances, the microwave or millimeter wave circuit section is oriented such that the microwave or millimeter wave circuit components are on a side of the second metallized polymer layer that is opposite the antenna, and the signal processing and control section is oriented such that the processing and control components are on a side of the third metallized polymer layer that is the same as that of the antenna section. In these instances, the first ground layer is preferably provided with a plurality of antenna feed slots, the first dielectric layer is preferably a polymer foam layer disposed adjacent the antenna section, the second dielectric layer is preferably a solid polymer layer, the third dielectric layer is preferably a polymer foam layer disposed adjacent the microwave or millimeter wave circuit components, the second ground layer preferably is a parasitic shield layer, and the fourth dielectric layer is preferably a polymer foam layer. The sensor in these instances preferably further comprises a fifth dielectric layer adjacent the third polymer layer and a third ground layer adjacent the fifth dielectric layer. A plurality of conductive vias preferably extend through the second dielectric layer and electrically connect the first ground layer with second metallization layer; and a plurality of conductive vias preferably extend through the fifth dielectric layer and electrically connect the third ground layer with the third metallization layer. The first ground layer is preferably provided on a fourth metallized polymer layer which comprises: (i) a fourth polymer layer having a thickness of less than 50 microns and (ii) a fourth metallization layer disposed on the fourth polymer layer, at least a portion of the fourth metallization layer adapted for operation as a ground layer. The second ground layer is preferably provided on a fifth metallized polymer layer which comprises: (i) a fifth polymer layer having a thickness of less than 50 microns and (ii) a fifth metallization layer disposed on the fifth polymer layer, at least a portion of the fifth metallization layer being adapted for operation as a parasitic shield layer. The third ground layer is preferably provided on a sixth metallized polymer layer which comprises: (i) a sixth polymer layer having a thickness of less than 50 microns and (ii) a sixth metallization layer disposed on the sixth polymer layer, at least a portion of the sixth metallization layer being adapted for operation as a ground layer. The first, second, third, fourth, fifth and sixth metallized polymer layers are preferably formed by establishing folds in a unitary metallized polymer layer.

One advantage of the present invention is that microwave and millimeter wave circuits and microwave and millimeter wave devices, including sensors and communications products, can be fashioned in a flexible format, allowing them to be conformed to non-flat surfaces, or to be insert-injection molded into products featuring non-flat or compound surfaces.

Another advantage of the present invention is that microwave and millimeter wave circuits and microwave and millimeter wave devices, including sensors and communications products, are provided which can be manufactured by means of continuous, low cost processing techniques.

These and other embodiments and advantages of the present invention will become immediately apparent to those of ordinary skill in the art upon reading the description and claims to follow.

DETAILED DESCRIPTION

Several preferred embodiments of the invention now will be more fully described, with reference to accompanying drawings where appropriate. This invention may, however, be embodied in different forms and should not be construed as limited to the embodiments set forth herein.

A first aspect of the present invention is directed to flexible circuits. The circuits are appropriate for operation at microwave and millimeter wave frequencies, typically 20 GHz to 100 GHz.

In accordance with one embodiment of the invention, a multilayer, flexible microwave/millimeter wave circuit is provided that comprises a first metallization layer, a second metallization layer, a dielectric substrate layer, and conductive vias electrically connecting portions of the first and second metallization layers.

Figure 1A:
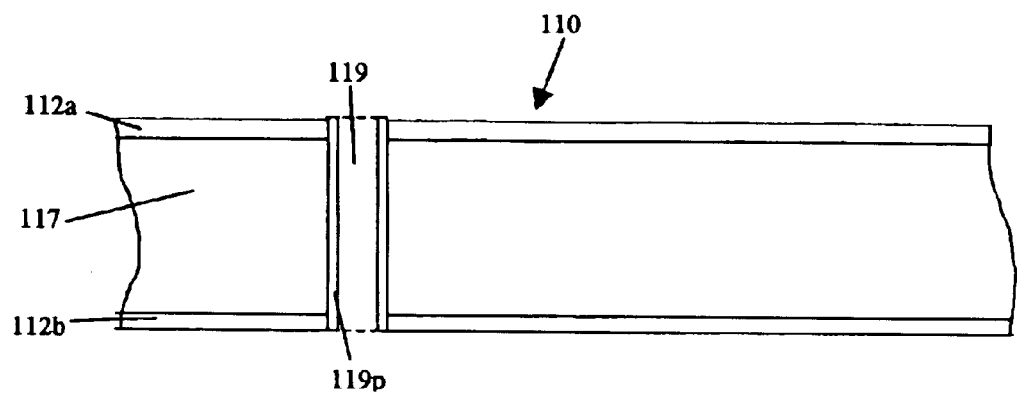
FIG. 1a is a partial, cross-sectional view in schematic, of a microwave/millimeter wave film circuit, according to an embodiment of the present invention.

FIG. 1a illustrates a partial cross-sectional view of a simple microwave/millimeter wave film circuit 110, according to an embodiment of the present invention. This circuit includes first metallization layer 112a and second metallization layer 112b. The metallization layers 112a, 112b can function, for example, as a microwave/millimeter wave circuits (which are provided with active and passive components, as appropriate) and a ground layer, respectively.

Between the first and second metallization layers 112a, 112b is provided a dielectric layer 117. The first and second metallization layers 112a, 112b may be laminated to the dielectric layer with adhesives. Alternatively, these layers can also be deposited on the surface of the dielectric layer 117 by an adhesiveless process, such as by a plating or sputtering process.

Also shown in FIG. 1a is a conductive via 119, which extends from metallization layer 112a, through dielectric layer 117, to metallization layer 112b. In this way, via 119 provides a conductive path between the metallization layer 112a and metallization layer 112b. Via 119 is provided with via plating 119p.

Figure 1B:
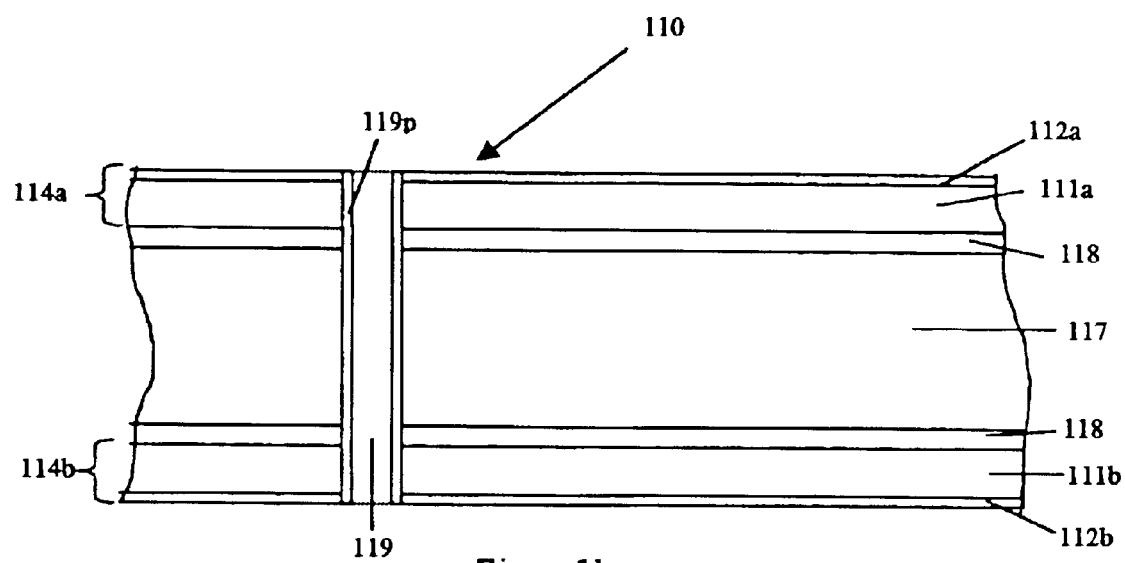
FIG. 1b is a partial, cross-sectional view, in schematic, of a microwave/millimeter wave film circuit, according to an embodiment of the present invention.

Other embodiments of the invention take advantage of thin metallized polymer films, which can be subsequently folded, stacked and laminated with each other and with other dielectric layers. As used herein a "film" is a dielectric layer that is less than about 250 microns in thickness. In this connection, FIG. 1b illustrates a partial cross-sectional view of a microwave/millimeter wave film circuit 110, according to an embodiment of the present invention. The view shown includes polymer film layer 111a and an adjacent metallization layer 112a, which together form metallized film layer 114a. Also shown is a polymer film layer 111b and an adjacent metallization layer 112b, which together form metallized film layer 114b. A dielectric layer 117 is provided between the metallized film layers 114a, 114b.

The stack formed by metallized film layer 114a, dielectric layer 117 and metallized film layer 114b is typically laminated together by means of adhesive layers 118. Although not shown in FIG. 1b, metallized films layers 114a, 114b can be formed simply by folding a single piece of metallized film and adhering the dielectric substrate layer 117 between them. By forming the metallized film layers 114a and 114b in this fashion, metallized lines can be provided on the folded portion of the metallized film, placing the metallization layers 112a, 112b in electrical contact with one another, if desired.

Typically, the polymer films layers 111a, 111b are both made of the same material. The polymer film layers 111a, 111b should be as thin as possible and only sufficiently thick to ensure stability and mechanical integrity during processing and use. For many materials, this means that the polymer film layers 111a, 111b can be 50 microns or less in thickness, and preferably about 25 microns. Preferred materials are those having the following characteristics: (1) good adhesion of plated or sputtered metal, (2) the ability to undergo adhesive bonding, (3) the ability to withstand temperatures of 150° C. (enabling the material, for example, to undergo elevated temperature processing, such as thermosonic wire bonding, etc.), and (4) adequate mechanical characteristics to support roll-to-roll processing (for example, the material should be non-stretching and durable). Preferred materials meeting these criteria include polyimide, polyetherimide, polyethylene terephthalate and polyethylene naphthalate, with polyimide being more preferred.

The patterning associated with the metallization layers 112a, 112b on polymer film layers 111a, 111b can be essentially infinite in variety. For example, as noted above in connection with FIG. 1a, the metallization layers 112a, 112b can be patterned to function as microwave/millimeter wave circuits (which are provided with active and passive components, as desired) and ground layers, as well as interconnection structures, patch antenna layers, and so forth. One typical metallization configuration is one where polymer film layer 111a is provided with microwave/millimeter-wave circuit metallization layer 112a, while the polymer film layer 111b is provided with ground metallization layer 112b.

The metallization layers 112a, 112b in FIG. 1a and FIG. 1b are preferably adhesiveless, as adhesive layers frequently reduce microwave/millimeter wave performance and reproducibility. The metallization typically includes a copper layer disposed on the polymer film layer. Copper is a preferred material as it possesses low microwave/millimeter-wave losses and is relatively low in cost. Copper thicknesses of 0.2 to 3.0 microns are typical. The actual copper thickness, however, typically depends on the operating frequency of the device. For example, a 1.26-micron thickness is preferred for a 24 GHz device and a 0.69-micron thickness is adequate for a 77 GHz device (these thicknesses support a 3×skin depth).

In some cases, it is desirable to create a metallized film that can support gold wire bonding (wedge and ball). In those cases, the copper can be provided with overlayers of nickel and gold, with the nickel layer acting as a barrier to gold and copper diffusion. Typically, the nickel and gold layer range from 0.5 to 1.5 microns in thickness, more preferably 0.7 to 1.3 microns.

The dielectric substrate layer 117 in FIGS. 1a and 1b is selected to provide low losses at microwave operating frequencies as well as mechanical ruggedness. Dielectric substrate layer 117 preferably supports adhesive bonding. Like the other components of these figures, dielectric substrate layer 117 preferably withstands sustained temperatures of 150° C. Dielectric substrate layer 117 also has a preferred dielectric constant ranging from 1 to 4. Dielectric substrate layer 117 is typically a solid polymer but can be a polymer foam layer. More preferably, a solid polymer layer is used to provide stable dimensional properties. Such layers typically have a dielectric constant ranging from about 2.0 to 3.5. Some preferred materials and typical dielectric constants for a solid polymer dielectric substrate layer 117 are polymethylpentene (2.1 dielectric constant), polyimide (3.5 dielectric constant), polyetherimide (3.0 dielectric constant), polyethylene terephthalate (2.8 dielectric constant), and polyethylene naphthalate (3.0 dielectric constant). Polymethylpentene is more preferred when a low loss dielectric is needed (0.001 loss tangent).

In general, the thickness of the dielectric substrate layer 117 is dictated by the electrical requirements of the circuit, with thicknesses of 100 to 250 microns being typical. For polymethylpentene, the thickness of the dielectric substrate layer 117 is typically selected to yield a spacing of about 250 microns between metallization layer 112a and metallization layer 112b.

As noted above, the metallized film layers 114a and 114b are preferably secured to dielectric substrate layer 117 by a dielectric adhesive layer 118. Preferred adhesives are able to withstand sustained temperatures of 150° C. or more. Preferred adhesives are those compositions that provide good thickness control. One such adhesive is Z-Flex®, an adhesive film sold by CPFilms, Martinsville, Va. Adhesive layers 118 are preferably 25 microns or less in thickness, typically about 10–15 microns.

The circuits 110 of FIG. 1a and FIG. 1b are also provided with conductive vias 119, which extend from metallization layer 112a, through the entire cross-section of circuit 110, to metallization layer 112b. In this way, via 119, with its attendant via plating 119p, provides a conductive path between the metallization layer 112a and metallization layer 112b. Vias may be made conductive by a plating process or by filling with a conductive epoxy. Vias are typically introduced to support shielding functions, circuit grounds and so forth. In microwave and millimeter wave circuits, numerous such vias are used, many of which are provided with center-to-center spacing of less than 0.10 times the operating wavelength. For a 24 GHz device, the spacing between vias is typically 750 microns center-to-center.

The length of via 119 is defined by the thickness of the layered structure and is typically on the order of 250 microns or less. The diameter of via 119 is typically less than or equal to the length of the via 119, the via diameter is also determined by the process chosen to effect the via hole. Holes for vias 119 can be provided by a number of processes including wet chemical etching, punching and laser ablation, with laser ablation preferred. Laser ablation is an industry standard technique in the making of polymer-based BGA packages with micro-via technology. Via holes are preferably formed before stacking the various layers. After stacking and laminating, the via hole is rendered conductive, for example by plating methods known in the art or by the use of conductive epoxies, with plating being presently preferred. A preferred material for via plating 119p is copper.

The microwave and millimeter wave circuit and device design of the present invention is advantageous in that existing continuous film processing technology can be used in their manufacture.

In accordance with one aspect of the present invention, continuous flow manufacture of microwave and millimeter wave circuits and devices is facilitated by the use of roll-to-roll polymer films, which are used as a carrier substrate for both radio-frequency and non-radio-frequency circuitry. Where required, semiconductor and passive components can be subsequently installed onto this circuitry in an automated, robotic manufacturing environment. Lamination of this circuitry with other dielectric and conductor layers (e.g., ground planes, antenna layers, etc.) results in a functional multilayer product that is specific to the application.

A specific example follows in which a circuit like that of FIG. 1b is fabricated.

First, a polymer film is metallized using techniques known in the art and used on a routine basis by a number of companies, including CPFilms, Sheldahl, and 3M. In one known process, a roll-to-roll technique is used in which a metal seed layer, such as a 0.15 micron copper seed layer (or a seed layer of a copper-containing alloy such as Monel 75A (which contains 67% Ni, 30% Cu, 1.4% Fe and 1% Mn) is sputtered onto a polymer film, such as a 25-micron polyimide film. Vias are then provided, for example, by laser ablation. Subsequently, a patterned positive photoresist layer is applied over the film, and the copper seed layer is then plated with additional copper to the desired thickness for example to a thickness of 0.13 microns for a 24 GHz circuit. Wet photoresist and etching processes are typical, but dry techniques (such as those involving drum-based pattern-transfer and lift-off) are preferred for environmental reasons, where feasible. Once the photoresist is removed, the copper seed layer can be removed by an etching process to leave only the desired copper circuit pattern on the film. This plating step is followed by nickel and gold plating steps, where desired. As a specific example, the metallized film can include microwave/millimeter-wave circuit metallization regions (like 112a above) and ground metallization regions (like 112b above).

At the same time, a dielectric layer is also provided with via holes, preferably by laser ablation, also in a roll-to-roll technique. The metallized film and dielectric layer are then cut. An adhesive is applied to one side of the metallized film and/or both sides of the dielectric layer. A laminated structure is then formed by folding the metallized film and inserting the dielectric layer within the fold, taking care to ensure that the vias are aligned. After the adhesive is cured, the via holes are plated, forming a laminated structure like that of FIG. 1b.

The circuit metallization regions can be provided with passive or active components, as desired, preferably before lamination. Techniques for attaching such components include, for example, chip and wire assembly, chip-on-board assembly and flip-chip assembly, preferably followed by chip-on-board passivation. Typical materials for chip-on-board passivation include unfilled silicones, silica-filled epoxies of appropriate expansion coefficient, and other appropriate polymer compounds.

Many variations on the above theme are possible. For example, when providing a ground metallization layer (like metallization layer 112b above), a freestanding metal film (with via apertures provided, if desired) can be directly attached to the dielectric substrate layer without an intervening polymer film layer (like layer 111b above). For instance, an adhesive nipping process can be used in which a foil of copper (typically ½ oz. or greater) is roll-to-roll laminated to the dielectric substrate with a thin intermediate layer of adhesive. The metal layer can be subsequently photo-etched by standard methods to provide desired features.

Another aspect of the present invention is directed to flexible microwave and millimeter wave devices. In particular, metallized polymer films representing circuit layers, ground layers, antenna layers, and so forth can be laminated along with various dielectric layers to provide a functional multilayer microwave/millimeter wave device.

As a specific example, a complete microwave/millimeter wave sensor is discussed herein that is flexible and can take advantages of roll-to-roll continuous film processing. Two designs are discussed below. However, it will be immediately apparent to those skilled in the art that myriad other sensor designs and other devices, such as communication devices, can be constructed based on the same principles.

Figure 2:
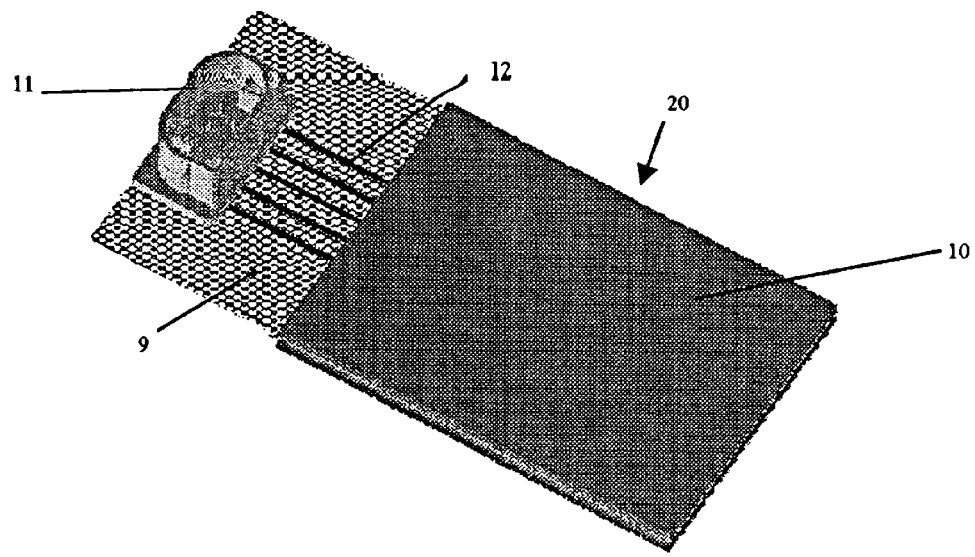
FIG. 2 is a schematic illustration of a microwave/millimeter wave sensor, according to an embodiment of the present invention.
Figure 3:
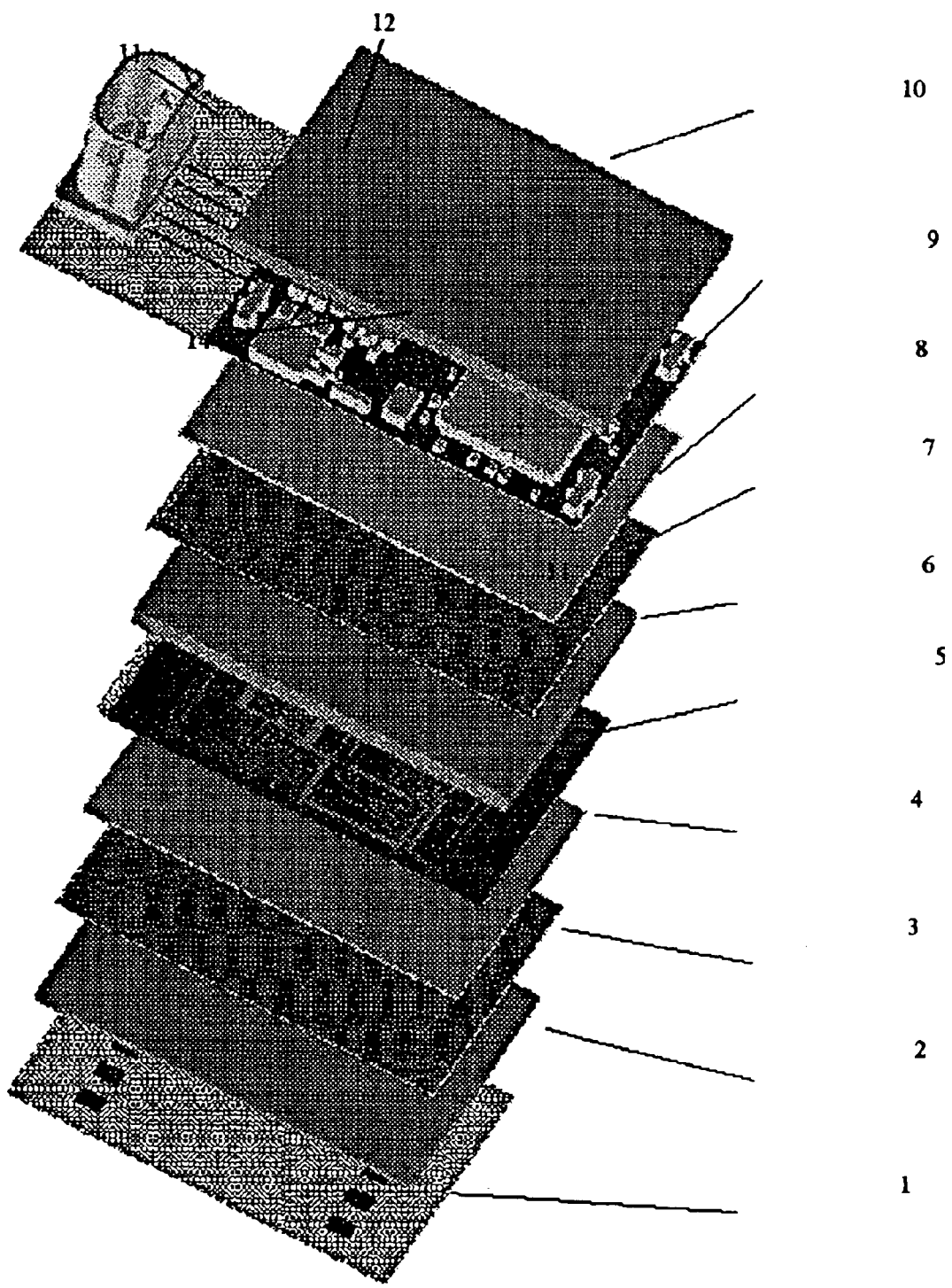
FIG. 3 is an exploded view of the sensor of FIG. 2.

A first sensor is illustrated in FIG. 2 and FIG. 3 (FIG. 3 represents an exploded view of the sensor of FIG. 2). Referring now to these figures, the sensor 20 consists of an assembly of the following layers: a metallized film layer 1, a dielectric foam layer 2, a metallized film layer 3, a dielectric substrate layer 4, a metallized film layer 5, a dielectric foam layer 6, a metallized film layer 7, a dielectric substrate layer 8, a metallized film layer 9 and a dissipative foam layer 10.

The following are provided using the principles discussed above in connection with FIG. 1b:
(a) metallized film layers 1, 3, 5, 7, 9,
(b) attachment of active and passive components 14 to metallized film layers 5, 9 (only a single component 14 on metallized film layer 9 is numbered),
(c) dielectric substrate layers 4, 8 and
(d) vias (not shown) between metallized films 3 and 5 and between metallized films 7 and 9.

A connector 11 and associated lines 12 (only one line is numbered) are also shown in connection with metallized film layer 9. In other embodiments, this connector function is provided by part of the sensor housing or may not be used at all.

Together, dielectric spacer layers 2, 6, 10 provide controlled spacing between sections, facilitate RF shielding, allow compression loading in final assembly, and serve the function of a radio frequency dielectric. These layers are typically dielectric foam polymer layers. Foam polymer layers provide a low dielectric constant and a loss factor that is a function of the foam density as well as the choice of polymer. These factors will also affect mechanical stiffness, but the presence of other surface layers will greatly influence the same.

Dielectric foam layers 2 and 6 (generically referred to herein as dielectric spacer layers) are formed from various closed-cell polymer structures to include polymethacrylimide (PMA), polyethylene (PE), and polyolefin (PO) and are typically formed of PO, as these materials have a low dielectric constant, are able to withstand sustained temperatures of 150° C., and are of relatively high compression rating (5–25 PSI @ 25° C.) providing good thickness stability. These layers are typically 1 to 5 millimeters in thickness.

Dissipative foam layer 10 (also generically referred to herein as a dielectric spacer layer) is preferably formed of a polymer structure similar to above but containing ferrous materials in suspension to provide a loss medium to high frequency magnetic fields. These materials have a low dielectric constant, and are able to withstand sustained temperatures of 150° C., and are of relatively low durometer providing good compressibility. This layer is typically 5 to 15 millimeters in thickness.

Figure 5:
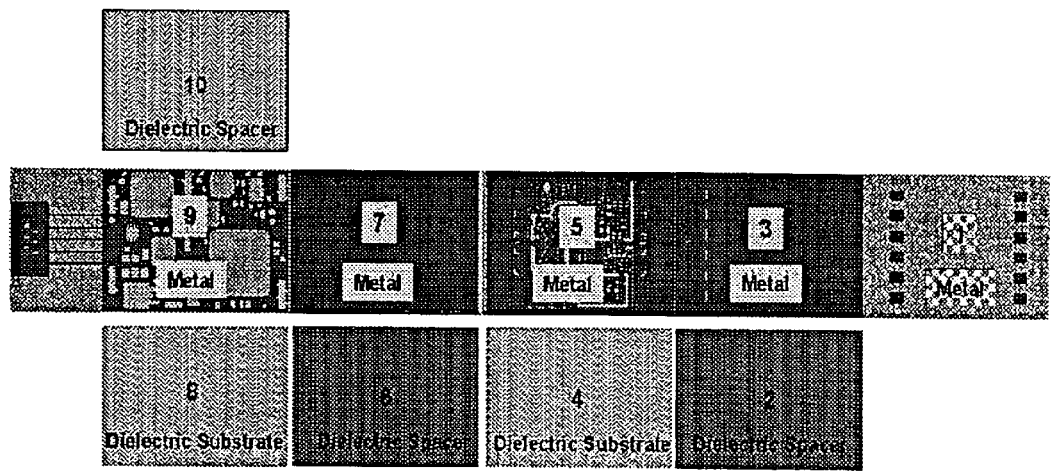
FIG. 5 is a schematic plan view of the various layers used in the construction of the sensor of FIG. 2.
Figure 6:
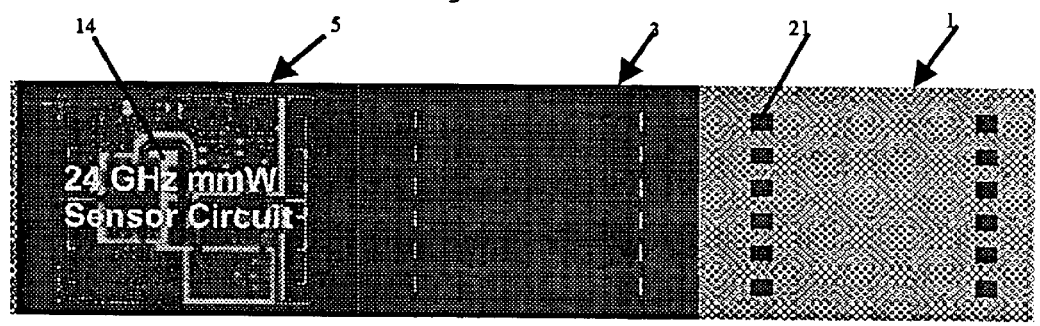
FIG. 6 is an enlarged view of certain of the layers illustrated in FIG. 5.
Figure 6:
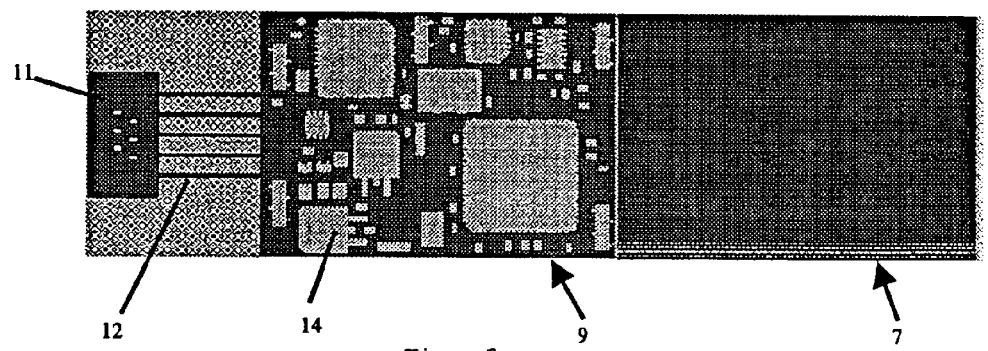

Layers 1, 2, 3, 4, 5, 6, 7, 8, 9, 10 are also shown in FIG. 5. FIG. 6 is an enlarged view of the metallized film layers 1, 3, 5, 7, 9 of FIG. 5 (this view necessitated a break between layers 5 and 7 for purposes of illustration).

As can be seen from these figures, metallized film layer 1 is provided with a metallization layer in the form of a patch antenna array (only one antenna element 21 is numbered). Such arrays are well known in the art of microwave/millimeter wave communications and sensors.

Metallized film layer 3 is a ground layer, but also contain two arrays of antenna feed slots (depicted in white and resembling two dashed lines) formed in the metallized layer. These slots allow the circuitry on metallized film layer 5 to activate the patch antenna array on metallized film layer 1.

Such structures are also well known in the art of microwave/millimeter wave communications and sensors.

Metallized film layer 5 supports the microwave/millimeter wave circuitry, in this case 24 GHz circuitry, associated with the sensor. Metallized film layer 9 supports the signal processing/DC regulation/control components (e.g., the digital signal processor, regulator, etc.) of the sensor. Such circuitry is also well known in the art. Active and passive circuit components are shown on these layers for purposes of illustration, but the appearance of the actual components will likely differ.

Metallized film layer 7 provides a ground layer between film layers 5 and 9. This layer 7 also contains circuit track metallization (the horizontal dark lines at the lower portion of the layer as seen in FIG. 6), which connect the metallization layer associated with the control circuitry of film layer 9 with the metallization layer associated with the microwave/millimeter wave circuitry of film layer 5.

In this connection, in many preferred embodiments of the present invention, a continuous metallized film strip is folded in an accordion fashion to establish metallized film layers 1,3,5,7,9. As noted above, a continuous film construction of the sensor 20 facilitates the interconnection of DC power, control and digital signal processing (DSP) functions of associated with metallized film layer 9 with the microwave/millimeter wave circuit functions associated with metallized film layer 5. After folding, dielectric substrate layers 4, 8 and dielectric spacer layers 2,6,10 are inserted into the folds along with appropriate adhesive layers, and the structure is compressed to form the sensor 20 of FIG. 2. Referring to FIG. 5, the stacking order of layers 1–10 is the same as the numerical order. The metallized film layers, dielectric substrate layers and dielectric spacer layers are preferably laminated in a continuous manufacturing operation to effect a complete tape assembly, which receives the electrical components prior to folding and compression to realized the final form shown in FIG. 2.

Figure 4:
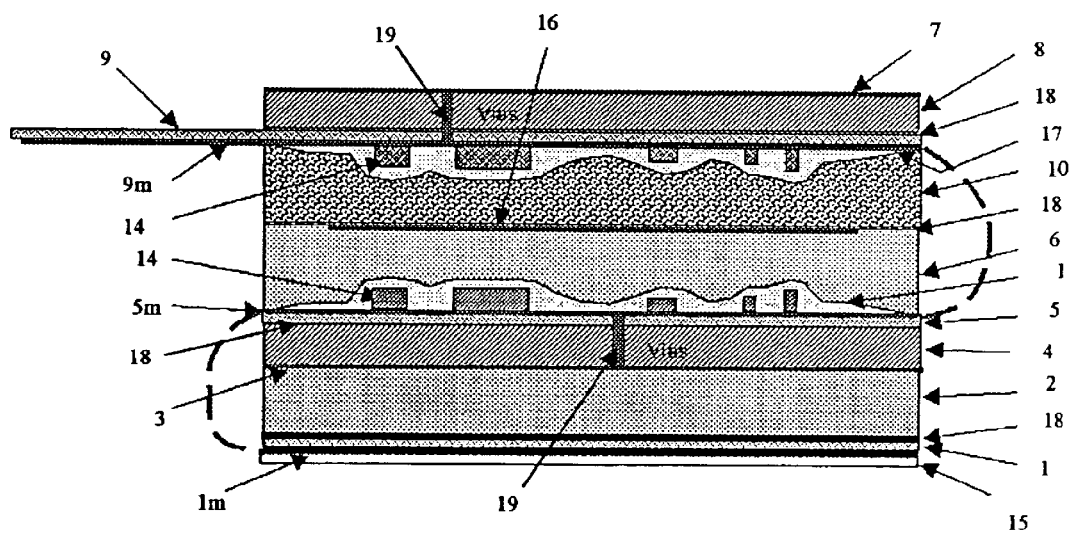
FIG. 4 is a schematic cross-sectional view of a microwave/millimeter wave sensor, according to an embodiment of the present invention.

FIG. 4 is a cross-sectional illustration of an alternative embodiment of a sensor in accordance with the present invention. The bottom layer illustrated is a moisture barrier layer 15. Materials that provide good moisture barrier capability include fluorocopolymers such as the ACLAR® products manufactured by Allied Signal. Typical thicknesses for this layer are 5 to 50 microns.

The moisture barrier layer 15 is adhered to metallized film layer 1 (which includes the patch antenna array provided in metallization layer 1m, as discussed above) by a layer of adhesive (not shown) such as silicone adhesive. Metallized film layer 1 is in turn adhered to dielectric foam layer 2 with an adhesive layer 18. Dielectric foam layer 2 is adhered (the adhesion layer is not shown), to metallized film layer 3, which includes a ground layer with waveguide slots as discussed above. Metallized film layer 3 is adhered (the adhesion layer not shown) to dielectric substrate layer 4, which is in turn adhered by adhesive layer 18 to metallized film layer 5 having metallization layer 5m. Vias 19 (only one shown) extend through dielectric substrate layer 4 and establish contact between the metallization layer 5m on metallized film layer 5 and the metallization layer (not separately shown) of metallized film layer 3. Active and passive components 14 (five are shown, of which only one is numbered) are attached to metallization layer 5m. The components 14 are encased in a conformal coating 17 such as an unfilled silicone or any of various filled epoxies exhibiting appropriate expansion coefficients to provide chip-on-board passivation. Dielectric foam layer 6 is adhered over the conformal coating 17 (adhesive layer not shown), which is in turn adhered to a dissipative foam layer 10 by adhesive layer 18.

In this embodiment, a parasitic shield layer 16 is disposed between the dielectric foam layer 6 and dissipative foam layer 10. Like layers 1,3,5,7, 9, this layer 16 is preferably a patterned metallized film layer. As shown, the parasitic shield layer 16 is not connected to other metallized layers by vias and so forth, but rather is electrically isolated from the remainder of the structure. However, by providing the metallization in a proper periodic array, the metallization can act as an effective microwave shielding function over a select band of frequencies.

At the top of the structure, a metallized film layer 7, which acts as a ground layer, is adhered to dielectric substrate layer 8 (the adhesive layer is not shown) which is in turn adhered via adhesive layer 18 to metallized film layer 9 having metallization pattern 9m as shown. Vias 19 (only one is illustrated) are established between the metallization layer 9m on metallized film layer 9 and the metallization layer (not separately illustrated) on metallized film layer 7, extending through dielectric substrate layer 8. Metallized film layer 9 supports active and passive components 14 (five are shown, of which one is numbered) for the signal processing/DC regulation circuit. Active and passive components 14 are encased in a conformal coating 17, providing chip-on-board passivation. Conformal coating 17 is adhered to dissipative foam layer 10 (the adhesive layer is not shown).

Figure 7:
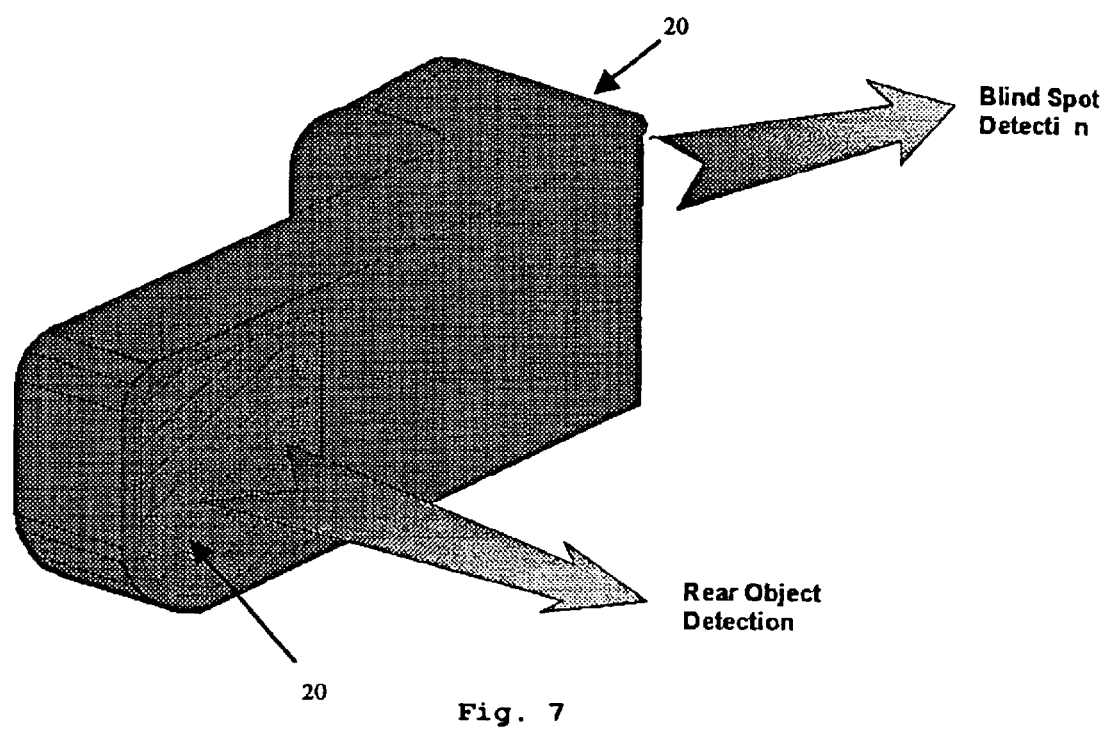
FIG. 7 is a schematic illustration of a pair of microwave/millimeter wave sensors integrated with an automobile tail-light.

A sensor like that of FIGS. 2, 3 and 4 is flexible, allowing it to be molded at the surface of structures with complex three-dimensional curves such as automotive parts. A pair of such sensors 20 is shown in connection with an automobile tail-light, as illustrated in FIG. 7. One of these sensors 20 is oriented for rear object detection and the other sensor 20 is oriented for blind spot object detection. Other automotive applications include air bag sensors and keyless entry sensors. Industrial applications include sensors for steering semi-autonomous robotic vehicles, security monitors, railroad crossing monitors, specialized smart cards and so forth. Military applications include helicopter safety sensors, disposable ground sensors, and security monitors.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A multilayer microwave or mm-wave circuit comprising:

a first metallization layer, at least a portion of said first metallization layer adapted for operation at a frequency ranging from 20 GHz to 100 GHz;

circuit components disposed on said first metallization layer, said circuit components selected from discrete semiconductor components and integrated circuit chips;

a second metallization layer, at least a portion of said second metallization layer adapted for operation as a ground plane;

a dielectric substrate layer, said dielectric substrate layer disposed between said first and second metallization layers; and a plurality of conductive vias extending through said dielectric substrate layer and through said first and second metallization layers and electrically connecting portions of said first and second metallization layers, wherein an interior surface of said conductive vias is plated with an electrically conductive material and a central portion of said conductive vias is substantially free of electrically conductive material, said multilayer microwave or mm-wave circuit being a flexible circuit.

2. The circuit of claim 1, wherein said first and second metallization layers are 0.2 to 3 microns in thickness.

3. The circuit of claim 1, wherein said dielectric substrate layer has a thickness ranging from 50 to 250 microns and a dielectric constant ranging from 1 to 3.5.

4. The circuit of claim 1, further comprising a first polymer layer having a thickness of less than 50 microns, wherein said first metallization layer is provided on said first polymer layer.

5. A multilayer microwave or mm-wave circuit comprising;
- a first metallized polymer layer comprising (a) a first polymer layer having a thickness of less than 50 microns and (b) a first metallization layer disposed on said first polymer layer, at least a portion of said first metallization layer being adapted for operation at a frequency ranging from 20 GHz to 100 GHz;
- circuit components disposed on said first metallization layer, said circuit components selected from discrete semiconductor components and integrated circuit chips;
- a second metallized polymer layer comprising (a) a second polymer layer having a thickness of less than 50 microns and (b) a second metallization layer disposed on said second polymer layer, at least a portion of said second metallization layer being adapted for operation as a ground plane;
- a dielectric substrate layer disposed between said first metallized polymer layer and said second metallized polymer layer; and
- a plurality of conductive vias extending through said dielectric substrate layer and through said first and second metallization layers and electrically connecting portions of said first and second metallization layers, wherein an interior surface of said conductive vias is plated with an electrically conductive material and a central portion of said conductive vias is substantially free of electrically conductive material, said multilayer microwave or mm-wave circuit being a flexible circuit.

6. The circuit of claim 5 wherein said first and second metallization layers range from 0.2 to 3 microns in thickness.

7. The circuit of claim 5 wherein said first and second polymer layers range from 10 to 25 microns in thickness.

8. The circuit of claim 5 wherein said first and second polymer layers are polyimide layers.

9. The circuit of claim 5, wherein said dielectric substrate layer is a polymethylpentene layer.

10. The circuit of claim 5, wherein said circuit components are attached by a technique selected from chip and wire assembly, chip-on-board assembly and flip-chip assembly.

11. The circuit of claim 5, wherein said first metallized polymer layer and said second metallized polymer layer are adhered to said dielectric substrate layer by an adhesive layer.

12. The circuit of claim 11, wherein said adhesive layer ranges from 10 to 25 microns in thickness.

13. The circuit of claim 5, wherein said vias comprise conductive epoxy-filled through-holes.

14. The circuit of claim 5, wherein said vias comprise metal-plated through-holes.

15. The circuit of claim 14, wherein said through-holes are formed by a process selected from laser ablation and mechanical punching operations.

16. The circuit of claim 5, wherein a plurality of said vias are spaced from one another via by a distance of no more than 0.25 times the operating wavelength or less.

17. The circuit of claim 5, wherein said first and second metallized polymer layers are formed by establishing a fold in a unitary metallized polymer layer.

18. The circuit of claim 5, wherein said first polymer layer, said second polymer layer, and said dielectric substrate layer are able to withstand sustained temperatures of at least 150° C.

19. The circuit of claim 5 wherein said first and second metallization layers are copper layers.

20. The circuit of claim 5, wherein said first and second metallization layers comprise copper sublayers on said first and second polymer layers, nickel sublayers over said copper sublayers, and gold sublayers over said nickel sublayers.

21. The circuit of claim 5, wherein said dielectric substrate layer ranges from 50 to 250 microns in thickness and has a dielectric constant ranging from 1 to 3.5.

22. A microwave or mm-wave sensor comprising:
- an antenna section comprising a first metallized polymer film layer;
- a circuit section comprising (a) circuit components and (b) a second metallized polymer film layer, which further comprises metallization adapted for operation at frequencies ranging from 20 GHz to 100 GHz;
- a signal processing and control section comprising (a) signal processing and control components and (b) a third metallized polymer film layer, which further comprises metallization adapted for said signal processing and control components;
- a fourth metallized polymer film layer comprising grounding metallization, portions of said second and fourth metallized polymer film layers being interconnected with one another by a plurality of conductive vias;
- a fifth metallized polymer film layer comprising grounding metallization, portions of said third and fifth metallized polymer film layers being interconnected with one another by a plurality of conductive vias; and
- a plurality of dielectric layers disposed between said first, second, third, fourth and fifth metallized polymer film layers, said microwave or mm-wave sensor being a flexible sensor.

23. The sensor of claim 22 wherein said dielectric layers are independently selected from the group consisting of dielectric polymer foam layers and dielectric solid polymer layers.

24. The sensor of claim 22, wherein said first metallized polymer film layer comprises a patch antenna array, wherein said fourth metallized polymer film layer is disposed between said first and second metallized polymer film layers, and wherein said grounding metallization of said fourth metallized polymer film layer comprises a plurality of antenna feed slots.

25. The sensor of claim 22, wherein said first, second, third, fourth and fifth metallized polymer film layers are formed by establishing folds in a unitary piece of metallized polymer film.

26. The sensor of claim 25, wherein said fifth metallized polymer film layer further comprises metallization lines connecting said second metallized polymer film layer with said third metallized polymer film layer.

27. The sensor of claim 22, further comprising an ungrounded parasitic shield layer, wherein said circuit components and said signal processing and control components are separated from one another by said ungrounded parasitic shield layer.

28. The sensor of claim 22, wherein said metallized polymer film layers and said dielectric layers are bonded together by a plurality of adhesive layers.

29. A microwave or millimeter wave sensor comprising:
an antenna section comprising a first metallized polymer layer, said first metallized polymer layer further comprising (i) a first polymer layer having a thickness of less than 50 microns and (ii) a first metallization layer disposed on said first polymer layer, at least a portion of said first metallization layer comprising a patch antenna array;
a microwave or millimeter wave circuit section over said antenna section, said microwave or millimeter wave circuit section comprising (a) circuit components and (b) a second metallized polymer layer, said second metallized polymer layer further comprising (i) a second polymer layer having a thickness of less than 50 microns and (ii) a second metallization layer disposed on said second polymer layer, at least a portion of said second metallization layer adapted for operation at a frequency ranging from 20 GHz to 100 GHz;
a signal processing and control section over said circuit section, said signal processing and control section comprising (a) signal processing and control circuit components and (b) a third metallized polymer layer which further comprises: (i) a third polymer layer having a thickness of less than 50 microns and (ii) a third metallization layer disposed on said third polymer layer adapted for said signal processing and control circuit components;
a first ground-dielectric section between said antenna section and said circuit section, said first ground-dielectric section comprising: (a) a first dielectric layer, (b) a first ground layer over said first dielectric layer and (c) a second dielectric layer over said first ground layer; and
a second ground-dielectric section between said circuit section and said signal processing and control section, said second ground-dielectric section comprising: (a) a third dielectric layer, (b) a second ground layer over said third dielectric layer and (c) a fourth dielectric layer over said second ground layer,
said sensor being a flexible sensor.

30. The sensor of claim 29, wherein said circuit section is oriented such that said circuit components are on a side of said second metallized polymer layer opposite the antenna section, and wherein said signal processing and control section is oriented such that said processing and control components are on a side of said third metallized polymer layer opposite the antenna section.

31. The sensor of claim 30, wherein said first dielectric layer is disposed adjacent said antenna section and comprises a polymer foam layer, wherein said first ground layer is provided with a plurality of antenna feed slots, wherein said second dielectric layer is a solid polymer layer, wherein said third dielectric layer is disposed adjacent said circuit components and comprises a polymer foam layer, and wherein said fourth dielectric layer is a solid polymer layer.

32. The sensor of claim 31, further comprising a fifth dielectric layer adjacent said processing and control components, said fifth dielectric layer comprising a polymer foam layer.

33. The sensor of claim 31,
wherein said first ground layer is provided on a fourth metallized polymer layer which comprises: (i) a fourth polymer layer having a thickness of less than 50 microns and (ii) a fourth metallization layer disposed on said fourth polymer layer, at least a portion of said fourth metallization layer adapted for operation as a ground layer; and
wherein said second ground layer is provided on a fifth metallized polymer layer which comprises: (i) a fifth polymer layer having a thickness of less than 50 microns and (ii) a fifth metallization layer disposed on said fifth polymer layer, at least a portion of said fifth metallization layer adapted for operation as a ground layer.

34. The sensor of claim 33, wherein said first, second, third, fourth and fifth metallized polymer layers are formed by establishing folds in a unitary metallized polymer layer.

35. The sensor of claim 34, wherein said fifth metallization layer further contains metallization lines connecting said second metallization layer with said third metallization layer.

36. The sensor of claim 31, further comprising
a plurality of conductive vias extending through said second dielectric layer and electrically connecting said first ground layer with second metallization layer and
a plurality of conductive vias extending through said fourth dielectric layer and electrically connecting said second ground layer with said third metallization layer.

37. The sensor of claim 29, wherein said circuit section is oriented such that said circuit components are on a side of said second metallized polymer layer that is opposite the antenna, and wherein said signal processing and control section is oriented such that said processing and control components are on a side of said third metallized polymer layer that is the same as that of the antenna section.

38. The sensor of claim 37, wherein said first dielectric layer is disposed adjacent said antenna section and comprises a polymer foam layer, wherein said first ground layer is provided with a plurality of antenna feed slots, wherein said second dielectric layer is a solid polymer layer, wherein said third dielectric layer is disposed adjacent said circuit components and comprises a polymer foam layer, wherein said second ground layer is a parasitic shield layer, and wherein said fourth dielectric layer is a polymer foam layer.

39. The sensor of claim 38, further comprising a fifth dielectric layer adjacent said third polymer layer and a third ground layer adjacent said fifth dielectric layer.

40. The sensor of claim 38,
wherein said first ground layer is provided on a fourth metallized polymer layer which comprises: (i) a fourth polymer layer having a thickness of less than 50 microns and (ii) a fourth metallization layer disposed on said fourth polymer layer, at least a portion of said fourth metallization layer adapted for operation as a ground layer;
wherein said second ground layer is provided on a fifth metallized polymer layer which comprises: (i) a fifth polymer layer having a thickness of less than 50 microns and (ii) a fifth metallization layer disposed on said fifth polymer layer, at least a portion of said fifth metallization layer adapted for operation as a parasitic shield layer and wherein said third ground layer is provided on a sixth metallized polymer layer which comprises: (i) a sixth polymer layer having a thickness of less than 50 microns and (ii) a sixth metallization layer disposed on said sixth polymer layer, at least a portion of said sixth metallization layer adapted for operation as a ground layer.

41. The sensor of claim 39, wherein said first, second, third, fourth, fifth and sixth metallized polymer layers are formed by establishing folds in a unitary metallized polymer layer.

42. The sensor of claim 39, further comprising:

a plurality of conductive vias extending through said second dielectric layer and electrically connecting said first ground layer with second metallization layer and a plurality of conductive vias extending through said fifth dielectric layer and electrically connecting said third ground layer with said third metallization layer.

* * * * *